United States Patent
Bradley et al.

(10) Patent No.: US 6,462,631 B2
(45) Date of Patent: Oct. 8, 2002

(54) PASSBAND FILTER HAVING AN ASYMMETRICAL FILTER RESPONSE

(75) Inventors: Paul Bradley, Mountain View; Richard C. Ruby, Menlo Park, both of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/783,773

(22) Filed: Feb. 14, 2001

(65) Prior Publication Data

US 2002/0109563 A1 Aug. 15, 2002

(51) Int. Cl.[7] .................................................. H03H 9/58
(52) U.S. Cl. ....................................... 333/189; 333/187
(58) Field of Search ................................ 333/189, 187, 333/191, 186, 188, 194, 195, 196; 310/331, 313 R, 313 B (56) References Cited

U.S. PATENT DOCUMENTS 5,332,982 A * 7/1994 Kawakami ................ 333/189
5,854,579 A * 12/1998 Penunuri ................ 310/313 B
6,051,907 A    4/2000 Ylilammi ................... 310/312

* cited by examiner

Primary Examiner—Robert Pascal
Assistant Examiner—Dean Takaoka (57) ABSTRACT

A filter, such as a transmit filter of a duplexer, includes an array of acoustic resonators that cooperate to establish an asymmetrically shaped filter response over a target frequency passband. The acoustic resonators are preferably film bulk acoustic resonators (FBARs). The filter response defines an insertion loss profile in which a minimum insertion loss within the target passband is located at or near a first end of the frequency passband, while the maximum insertion loss is located at or near the opposite end of the frequency passband. In the transmit filter embodiment, the minimum insertion loss is at or near the high frequency end of the filter response, which is tailored by selectively locating poles and zeros of the array of FBARs.

14 Claims, 8 Drawing Sheets

PASSBAND FILTER HAVING AN ASYMMETRICAL FILTER RESPONSE

TECHNICAL FIELD

The invention relates generally to acoustic resonators and more particularly to tailoring the filter response for a passband filter having film bulk acoustic resonators.

BACKGROUND ART

In different communications systems, the same signal path functions as both an input to a receiver and an output from a transmitter. For example, in a cellular or cordless telephone, an antenna may be coupled to the receiver and to the transmitter. In such an arrangement, a duplexer is often used to couple the common signal path to the input and to the output. The function of the duplexer is to provide the necessary coupling to and from the common signal path, while preventing the signals generated by the transmitter from being coupled to the input of the receiver.

Figure 1:
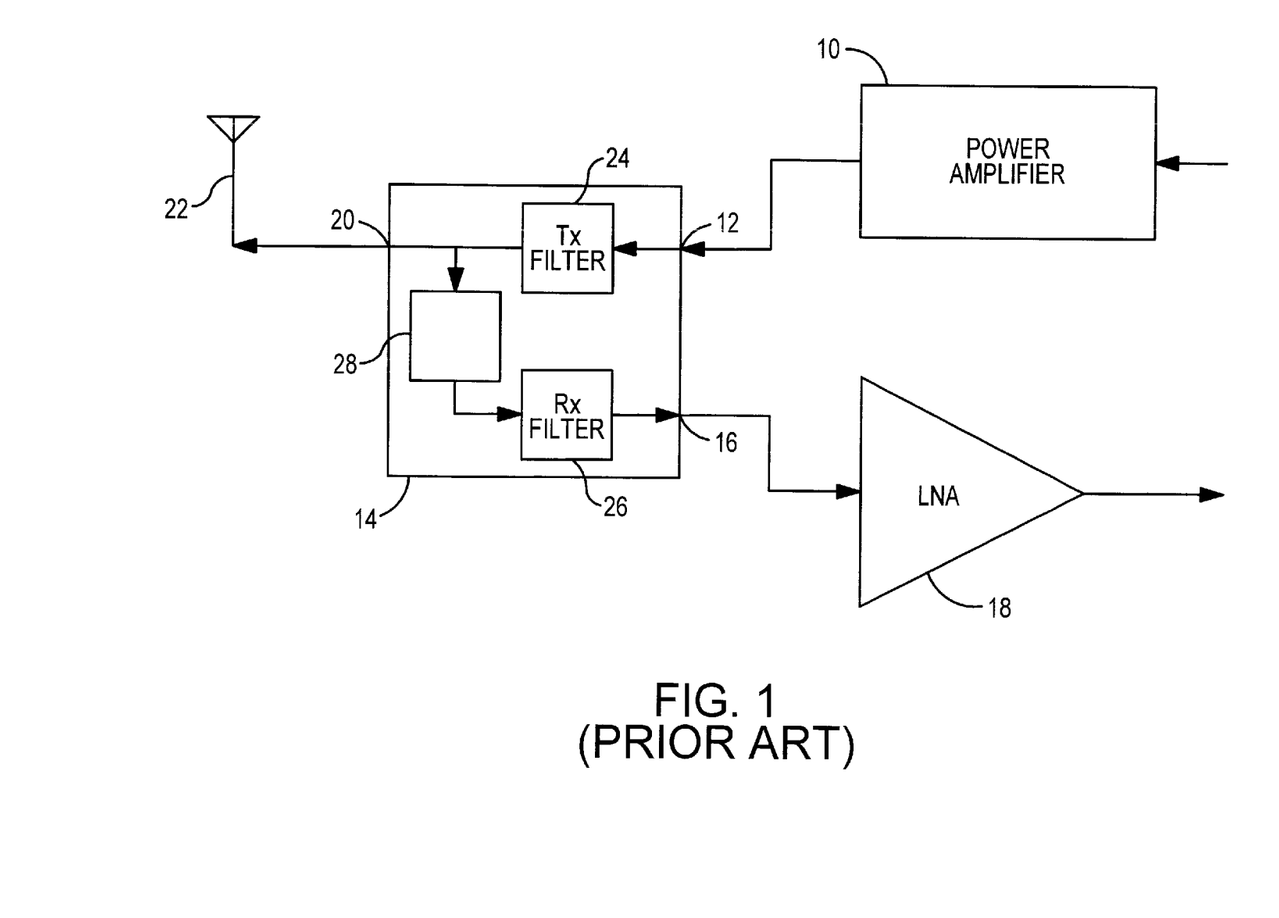
FIG. 1 is a block diagram of front-end circuitry of a conventional cellular telephone or similar device.

One type of duplexer is referred to as a "full duplexer." A full duplexer operates properly only if the transmit signal is carried at a frequency that is different than the frequency of the receive signal. The full duplexer utilizes passband filters that isolate the transmit signal from the receive signal according to the frequencies. FIG. 1 illustrates a conventional circuit used in cellular telephones, personal communication system (PCS) devices and other transmit/receive devices. A power amplifier 10 of a transmitter is connected to a transmit port 12 of a full duplexer 14. The duplexer also includes a receive port 16 that is connected to a low noise amplifier (LNA) 18 of a receiver. In addition to the transmit port and the receive port, the duplexer includes an antenna port 20 which is connected to an antenna 22.

The duplexer 14 employs a transmit passband filter 24, a receive passband filter 26, and a phase shifter 28. The passbands of the two filters 24 and 26 are respectively centered on the frequency range of the transmit signal from the transmit port 12 and the receive signal to which the receiver is tuned.

The requirements of the passband filters 24 and 26 of the duplexer 14 are stringent. The passband filters must isolate low intensity receive signals generated by the antenna for input to the low noise amplifier 18 from the strong transmit signals generated by the power amplifier 10. In a typical embodiment, the sensitivity of the low noise amplifier may be in the order of –100 dBm, while the power amplifier may provide transmit signals having an intensity of approximately 28 dBm. The duplexer 14 must attenuate the transmit signal by approximately 50 dB between the antenna port 20 and the receive port 16 to prevent any residual transmit signal that may be mixed with the receive signal from overloading the low noise amplifier 18.

Figure 2:
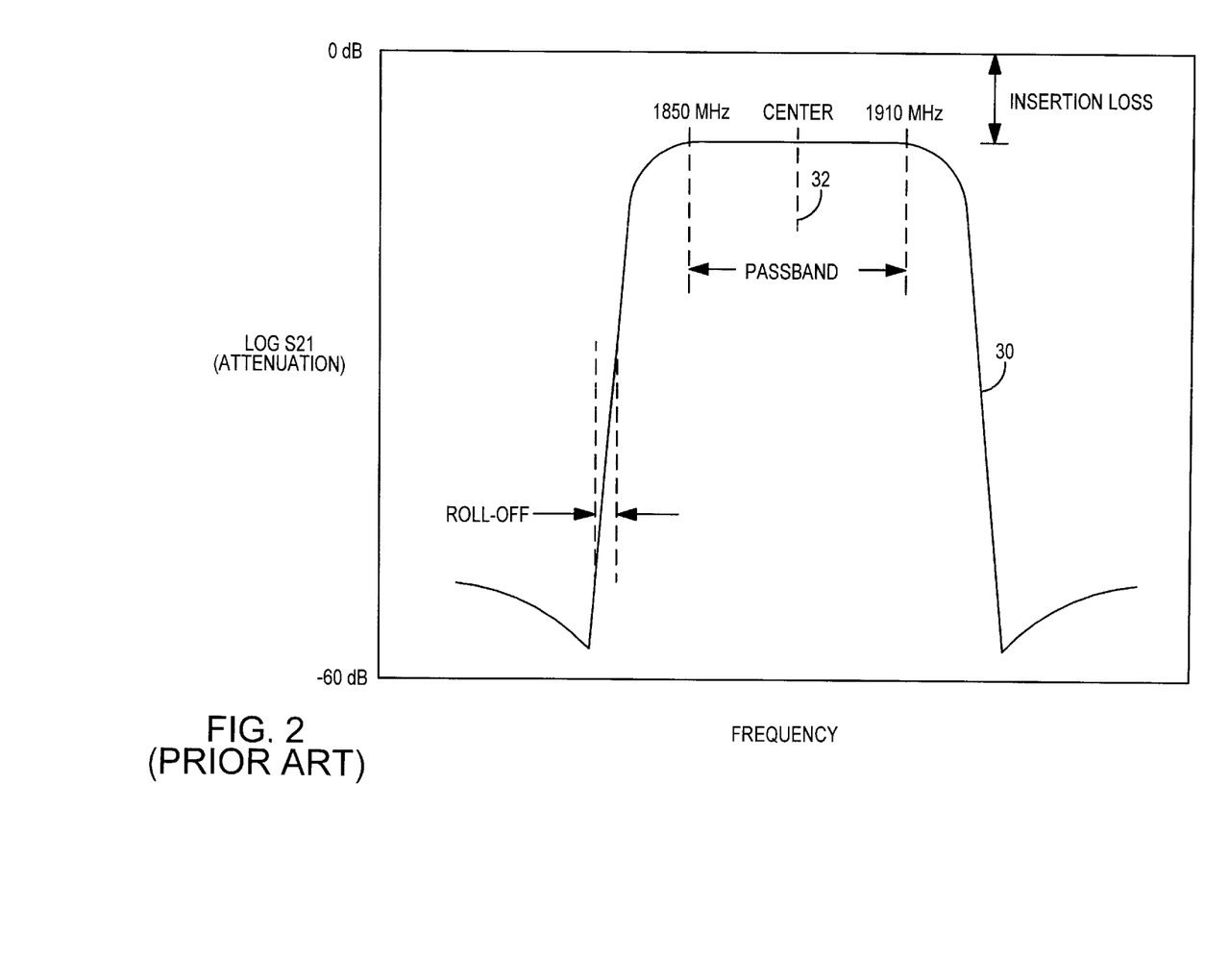
FIG. 2 is a graph of a filter response of a conventional transmit filter of a 1900 MHz cellular telephone.

One standard for use in PCS devices for a mobile telephone is the code division multiple access (CDMA) standard. A CDMA 1900 MHz mobile phone has a transmit filter 24 with a passband of 1850 MHz to 1910 MHz and has a receive filter 26 with a passband of 1930 MHz to 1990 MHz. A filter response 30 for the transmit filter is shown in FIG. 2. The filter response is defined by poles and zeros (i.e., nulls) of acoustic resonators. The poles and zeros are equidistantly spaced from a center frequency 32. During ideal conditions, the attenuation within the range of frequencies from 1850 MHz to 1910 MHz is relatively small. That is, the filter response 30 exhibits a relatively small insertion loss. On the other hand, the attenuation beyond the target passband is substantial. As shown in FIG. 2, there is a steep roll-off at both the high frequency end and the low frequency end of the filter response. The steep roll-off at the high frequency end ensures isolation from the passband of the receive filter 26, which is only 20 MHz above the passband of the transmit filter.

There are a number of available approaches to fabricating a duplexer. The conventional approach is to use ceramic technology. That is, ceramic-based half-wave and quarter-wave resonators are fabricated and connected to provide the poles and zeros which define the desired filter response. A significant built-in advantage of ceramic filters is that the temperature coefficient of such a filter is close to zero. Thus, the filter response does not materially change in shape or location as a result of temperature variations.

One concern with the use of ceramic duplexers is that there is a relationship between the quality factor "Q" of the filter and the size of the filter. For a ceramic filter, Q decreases with the decreasing size of the filter. In applications such as the CDMA market, the guard band between the transmit passband and the receive passband is very narrow (20 MHz). Since Q affects the steepness of the roll-off of the filter response, the Q must remain within a set range if the roll-off of the filter response is to meet the specifications set forth by the requirements of the system. Therefore, the duplexer that is fabricated using ceramic technology has a certain minimum volume that is relatively large. In fact, of the components of a CDMA 1900 MHz telephone, only the battery is larger than a ceramic-based duplexer.

Alternative approaches to using ceramic-based duplexers include fabricating surface acoustic wave (SAW) duplexers or film bulk acoustic resonator (FBAR) duplexers. Both of these types of duplexers occupy much smaller volumes than the ceramic duplexers, since the limiting factors for the Q are governed by the properties of sound waves, rather than electrical resistance. A typical SAW or FBAR die size (e.g., silicon chip size) is on the order of 0.25 mm. The height is governed by the die package requirements, but can be made under 2 mm. A drawback for both SAW and FBAR duplexers is that both technologies suffer from frequency shifts as a result of temperature variations. As the duplexer increases in temperature, the stiffness of the resonating materials decreases. The decrease in material stiffness results in a shift in the sound wave velocity, since the sound velocity is dependent upon the square root of the mass density divided by the stiffness. It follows that the filter response shifts downwardly in frequency as the temperature rises. SAW duplexers also have problems with power handling capabilities and achieving a relatively high Q. It has not yet been shown that SAW duplexers can meet the performance requirements for use in CDMA 1900 MHz telephones.

FBAR technology has three advantages over SAW technology. First, FBAR duplexers have been shown to have excellent power handling abilities. Second, FBAR resonators demonstrate Qs that are significantly higher than those identified in publications regarding SAW resonators. Using FBAR resonators, it is possible to achieve a 10.5 MHz roll-off (from 3.3 dB to 47.5 dB) for the transmitter portion of a CDMA PCS duplexer. In comparison, ceramic duplexers have approximately a 20 MHz roll-off. The third advantage of FBAR duplexers over SAW duplexers is that they tend to have a lower temperature coefficient. SAW resonators made from lithium niobate have a frequency shift of approximately 90 ppm/° C., and SAW resonators made with lithium tantalate have a frequency shift of approximately 34 ppm/° C. In comparison, FBAR duplexers have been measured to have a frequency shift between 20 and 30 ppm/° C.

As previously noted, within the CDMA PCS specification, there is a 20 MHz guard band between the transmitter and receiver passbands. The goal of a duplexer is to allow as much energy through each passband, while rejecting nearly all energies outside of the passband. If a realistic FBAR duplexer has a 50 dB roll-off in 10 MHz, this leaves 10 MHz for process variation and temperature shift. In percentage terms, this is slightly greater than 0.5 percent (i.e., 10 MHz/1920 MHz). If it is assumed that an FBAR filter has a temperature-dependent frequency shift of 30 ppm/° C., and it is assumed that system requirements must meet specifications over a temperature range of −20° C. to 60° C., the total temperature shift may be as great as 4.8 MHz. Additionally, heating of the FBAR filter as a result of absorption of input power may extend the potential frequency shift to 6 MHz. Using 10 MHz for the roll-off and 6 MHz for the temperature-induced shift, there are only 4 MHz that remain for process variations within the fabrication procedure. Moreover, there are back-end variations in assembly which may affect the tolerances.

What is needed is a filter and a method of fabricating the filter which mitigate the adverse effects of temperature variations.

SUMMARY OF THE INVENTION

A filter includes an array of acoustic resonators that cooperate to establish an asymmetrical filter response over a target passband of frequencies. In the preferred embodiment, the acoustic resonators are film bulk acoustic resonators (FBARs) that include series FBARs coupled in electrical series and at least one shunt FBAR that is connected between adjacent series FBARs. The series FBARs determine the response characteristics at one end of a filter response over the target passband, while the shunt FBAR or FBARs determine the response characteristics at the opposite end. In the most preferred embodiment, the filter is a transmitter portion of a duplexer, so that the series FBARs determine the response characteristics at the high frequency end. In this embodiment, the passband of the filter has an insertion loss profile in which a minimum insertion loss is located at or near the high frequency end of the filter response and a greater insertion loss is exhibited at the low frequency end.

The passband of the filter is determined by the resonant frequencies of the acoustic resonators. Poles and zeros are selected to tailor the filter response. In the preferred embodiment, the insertion loss profile of the filter response over the target passband progressively declines from the minimum insertion loss located at or near the high frequency end of the target passband to a maximum insertion loss located at or near the low frequency end. That is, there is a filter response slope within the target passband. Furthermore, there preferably is a steep roll-off adjacent to the high frequency end of the target passband and a gradual roll-off adjacent to the low frequency end. The tailoring of the filter response can be accomplished using known methods, such as by selectively adjusting the effective coupling coefficients of the FBARs or by selectively adjusting the impedances of the FBARs. As another alternative, auxiliary inductances may be intentionally introduced into electrical series with one or more of the FBARs, so as to slightly reduce the resonant frequency. For example, all of the shunt FBARs of a transmitter filter may be fabricated to have the same resonant frequency, but one shunt FBAR may be connected to an auxiliary inductor that changes the characteristics of the transmitter filter at the low frequency end of the passband.

The goal in the tailoring of the filter response is to address the "worst case" scenario for operation of the system in which the filter resides. The tailoring sacrifices performance at the duplexer portion of the system in order to compensate for weaknesses at the power amplification portion. This "worst case" scenario occurs when the ambient temperature and the power requirements are simultaneously high. The elevated temperature tends to negatively affect the efficiency of the power amplifier. When the efficiency of the power amplifier decreases as a result of a temperature increase, the operation of the power amplifier is automatically adjusted by signaling from the base station to compensate for the loss in radio frequency (rf) power. The resulting power boost requires higher amounts of heat to be dissipated as a result of the increased dc losses.

Another factor of the "worst case" scenario is that as the FBAR filter begins to heat and the filter response shifts downwardly in frequency, the power absorbed by the filter increases dramatically. This increases the temperature of the filter. At higher temperatures, a given filter will experience more insertion loss across its entire passband. The higher insertion loss causes more power to be dissipated in the filter. All of these factors contribute to a "positive feedback" effect. The signal that is transmitted to the antenna will degrade quickly as conditions approach the "worst case" scenario.

By tailoring the filter response in the manner described above, a "hump" is formed at the high frequency end of the transmitter portion of a duplexer. There is a reduction in filter performance at the low frequency end as a result of the tailoring at the high frequency end, but the overall system performance is enhanced. As ambient temperatures rise and power from the power amplifier increases (increasing both circuit board temperature and locally elevating the filter temperature via additional power absorbed at the filter), the overall insertion loss of the filter remains substantially constant.

The description of the "worst case" scenario relates only to the high frequency end of the filter response of the transmitter portion. The present invention recognizes that the adverse effects exhibited at the low frequency end of the passband are significantly less severe. If the ambient temperature drops from room temperature to −20° C., the insertion loss will be less than what it would be for a filter having a symmetrical filter response. However, there are two mitigating factors that create a "negative feedback" effect (as opposed to the positive feedback effect described above). The first mitigating factor is that as the temperature decreases, the overall insertion loss reduces, since electrical losses and thermo-acoustic scattering losses decrease. The second mitigating factor is that the power amplifier is "slaved" to the PCS base station. If the base station perceives that the power amplifier is not generating sufficient power, it will instruct the remote PCS device to increase the power output of the power amplifier. At lower temperatures, the power amplifier is more efficient and can comply with the request of the base station without dissipating a great amount of power. With the increase in power, the filter is heated by the added power directly in the FBAR filter and by the residual increase in heat emanated from the power amplifier.

The strategy of designing the asymmetrical filter response allows designers to overcome a major problem of performance degradation at elevated temperatures. Such a design is particularly useful in applications in which there are extremely tight tolerances and error budgets, such as those associated with the 1900 MHz PCS band. However, the asymmetrical filter response carries benefits in other applications.

DETAILED DESCRIPTION

Figure 3:
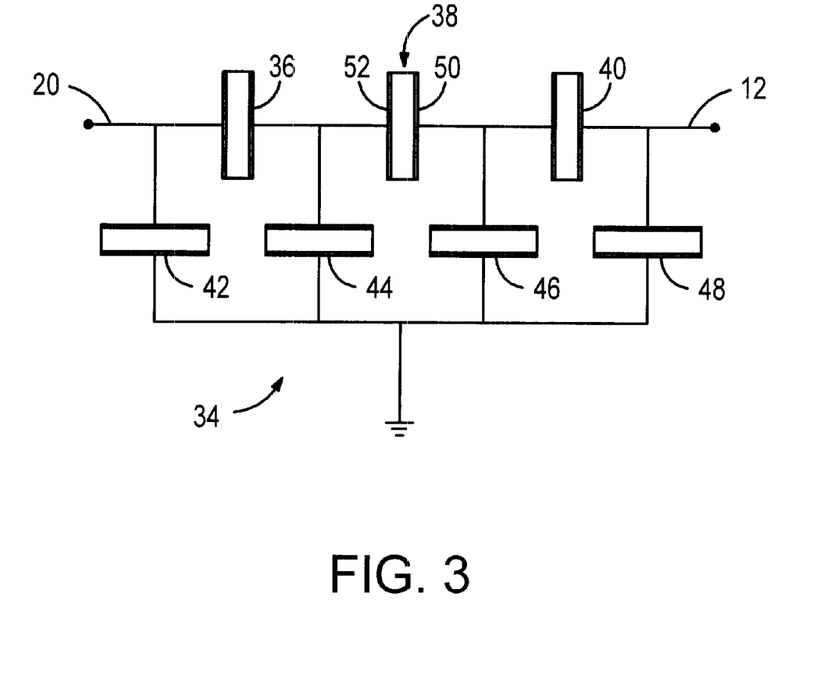
FIG. 3 is a block diagram of a transmitter filter fabricated in accordance with the present invention.

With reference to FIG. 3, an example of an array of FBAR resonators that are interconnected to form a transmit filter is shown as a 3½-stage ladder circuit. The transmit filter 34 includes three series FBARs 36, 38 and 40 and four shunt FBARs 42, 44, 46 and 48. However, other filter topologies may be used, such as a transmit filter having two series FBARs and two shunt FBARs. The three series FBARs are coupled in electrical series between a transmit port 12 and an antenna port 20. As shown in FIG. 1, the transmit port may be connected to a power amplifier 10, while the antenna port 20 may be connected to an antenna 22. As is well known in the art, the transmit filter 34 passes selected frequencies, while rejecting other frequencies.

Each of the FBARs 36–48 includes a pair of electrodes that sandwich a piezoelectric material. For example, the series FBAR 38 may include two molybdenum layers 50 and 52 on opposite sides of an aluminum nitride layer 54. The resonant frequency of the FBAR depends upon factors that include the selected materials and selected thicknesses of the electrode and piezoelectric layers. To achieve a resonant frequency of approximately 1900 MHz, each electrode layer may have a thickness of 1100 Å and the aluminum nitride may have a thickness of 2.2 microns. However, these thicknesses are not critical to the invention.

The series coupling of the FBARs 36, 38 and 40 is achieved by connecting the electrode layers. Thus, the series FBAR 36 has one electrode layer connected to the antenna port 20 and the opposite electrode layer connected to electrode layer 52 of series FBAR 38. Similarly, the series FBAR 40 has one electrode connected to the transmit port 12 and the opposite electrode connected to the electrode layer 50 of the series FBAR 38.

Figure 4:
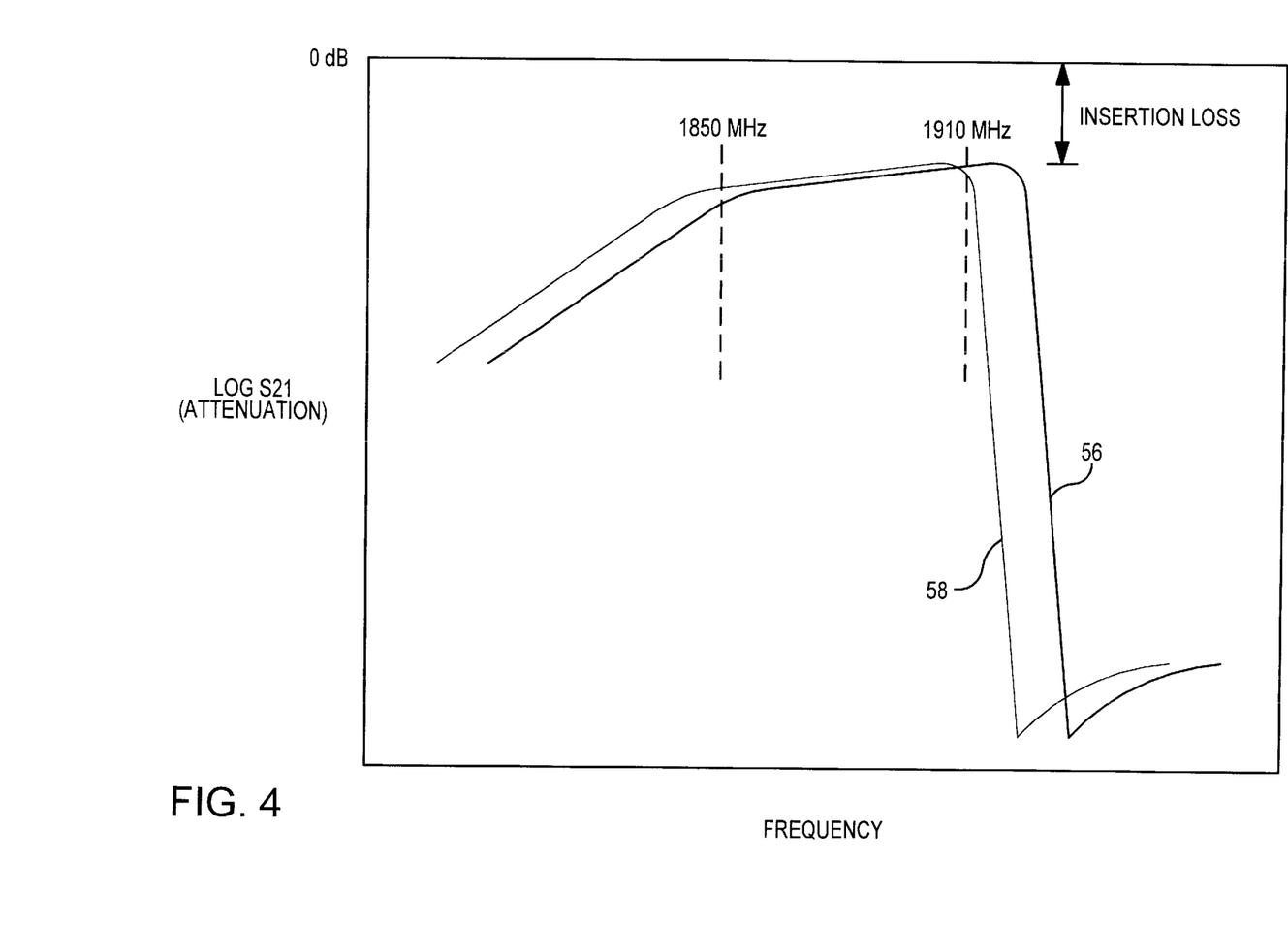
FIG. 4 is the filter response of the transmitter filter of FIG. 3 shown in both a normal condition and a condition in which elevated temperatures have shifted the filter response downwardly in frequency.

Each shunt FBAR 42–48 has one electrode layer connected to electrical ground and has the opposite electrode connected to the series circuit of the series FBARs 36–40. The fabrication and interconnection of the FBARs 36–48 are selected so as to achieve the asymmetrical (sloped) filter response 56 shown in FIG. 4. The invention will be described with reference to applications in which the target passband is the passband of the transmitter portion in a duplexer for a 1900 MHz telephone. However, the invention may be used in other applications. As shown in FIG. 4, the filter response 56 exhibits a minimum insertion loss near the high frequency end of the target passband (i.e., 1850 MHz to 1910 MHz). The insertion loss increases with approach to the low frequency end of the target passband. In the preferred embodiment, the filter response has a steep roll-off at the high frequency end, but a gradual roll-off in the region below the low frequency end. The steep roll-off at the high frequency end ensures isolation of the transmitter signals from the receive signals. As will be explained more fully below, the gradual roll-off at the region below the low frequency end provides acceptable signal passage during particularly cold operating conditions for the 1900 MHz telephone.

The asymmetrical passband 56 of FIG. 4 may be fashioned by properly selecting the poles and zeros (nulls). A hump at the high frequency end may be formed by appropriately "piling" poles and zeros around the steep roll-off. This may be achieved using techniques known in the art. A selection of the resonant frequencies of the series FBARs 36–40 and the shunt FBARs 42–48 of FIG. 3 determines characteristics of the filter response. The resonant frequency of an FBAR is dependent upon the "weighted thickness" of the electrode-piezoelectric stack that forms the FBAR. The weighted thickness is the physical thicknesses of the layers with an adjustment that is based upon the selection of the electrode and piezoelectric materials. The adjustment is necessary, since the velocity of sound is different in different materials. Changing the physical thickness or the material for one or more of the electrodes changes the weighted thickness of the electrode-piezoelectric stack, thereby adjusting the resonant frequency of the stack.

Poles and zeros for the filter response 56 are also determined by the areas of the electrode-piezoelectric stacks that form the FBARs 36–48. The area of an FBAR will affect the impedance of the FBAR.

In addition to changing the resonant frequencies, variations in the layer thicknesses of the electrode-piezoelectric stacks will affect the effective coupling coefficients ($kt^2$) of the FBARs 36–48. A conventional (i.e., intrinsic) effective coupling coefficient is in the range of 4.0 percent to 7.0 percent, and is more likely to be within the range of 5.0 percent to 6.0 percent. For the series FBAR 38 of FIG. 3, the electrode layers 50 and 52 may each have a thickness of 1100 Å and the piezoelectric layer 54 may have a thickness of 2.2 microns, so as to achieve a resonant frequency for a CDMA-compatible transmit filter that provides an effective coupling coefficient in the range of 5.6 percent to 5.8 percent. As an alternative, each electrode layer 50 and 52 may have a thickness of 2200 Å and the aluminum nitride layer 54 may have a thickness of 1.65 microns in order to provide approximately the same frequency, but with an effective coupling coefficient of approximately 5.4 percent. As a third alternative, the electrode layers may have a thickness of approximately 4500 Å and the aluminum nitride layer may have a thickness of approximately 8000 Å, providing the specification-required resonant frequency at a degraded effective coupling coefficient in the range of 3.1 percent to 3.2 percent.

The shunt FBARs 42–48 of FIG. 3 determine the passband characteristics at the low frequency end of the filter response 56 of FIG. 4, while the series FBARs 36–40 determine the characteristics at the high frequency end. Thus, by properly tailoring the physical and electrical properties of the FBARs, the different characteristics at the opposite ends of the filter response 56 of FIG. 4 may be realized.

The filter response 56 of FIG. 4 is shown in the condition in which it is designed when the transmit filter 34 of FIG. 3 is operated at room temperature. However, the position of the poles and zeros of the filter response relative to the target passband will shift with variations in temperature. A frequency-shifted filter response 58 is also shown in FIG. 4. The position of the filter response relative to the target passband will shift downwardly with increases in temperature. A decrease in material stiffness as a result of a decrease in the sound wave velocity is one factor in triggering the filter response shift represented in FIG. 4. However, there are other temperature-dependent factors that affect the position of the filter response of an FBAR filter. Elevated temperatures tend to affect the efficiency of the power amplifier, such as the power amplifier 10 of FIG. 1. The operation of the power amplifier is "slaved" to the PCS base station, so that the base station will transmit a command to increase the power output if there is a loss in transmitted radio frequency power. The increase in power by the amplifier results in further heat dissipation within the device. Another factor is that as the FBAR filter begins to heat and the filter response shifts downwardly in frequency, the power absorbed by the filter increases significantly. This adds to the increase in the temperature of the filter. While not shown in FIG. 4, an increase in the temperature of a particular filter will increase the insertion loss across the entire passband. The higher insertion loss causes more power to be dissipated in the filter. All of these factors contribute to a "positive feedback" effect with respect to an increase in temperature.

Figure 5:
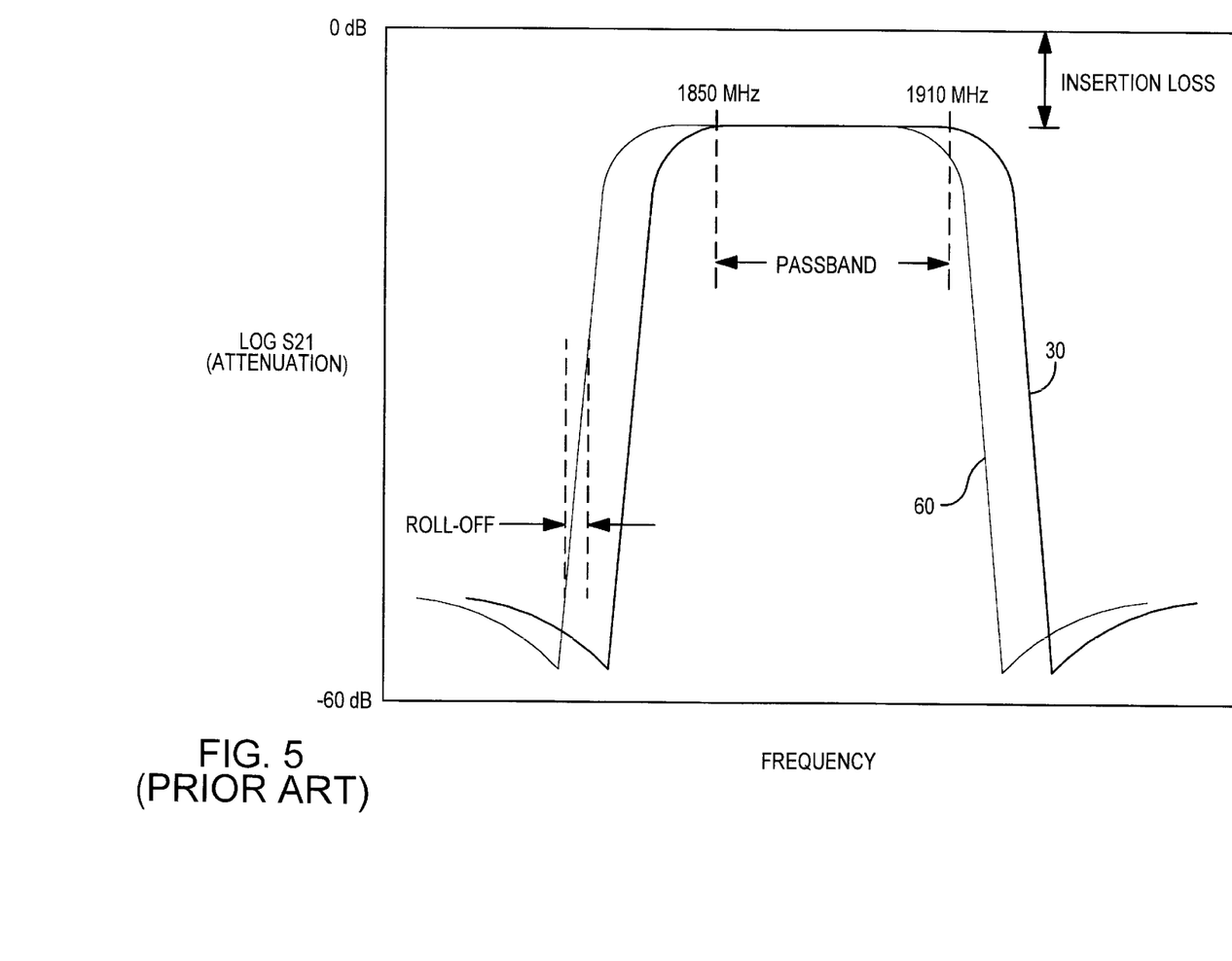
FIG. 5 shows the filter response of FIG. 2 in its normal condition and in a condition in which elevated temperatures have shifted the filter response downwardly in frequency.
Figure 6:
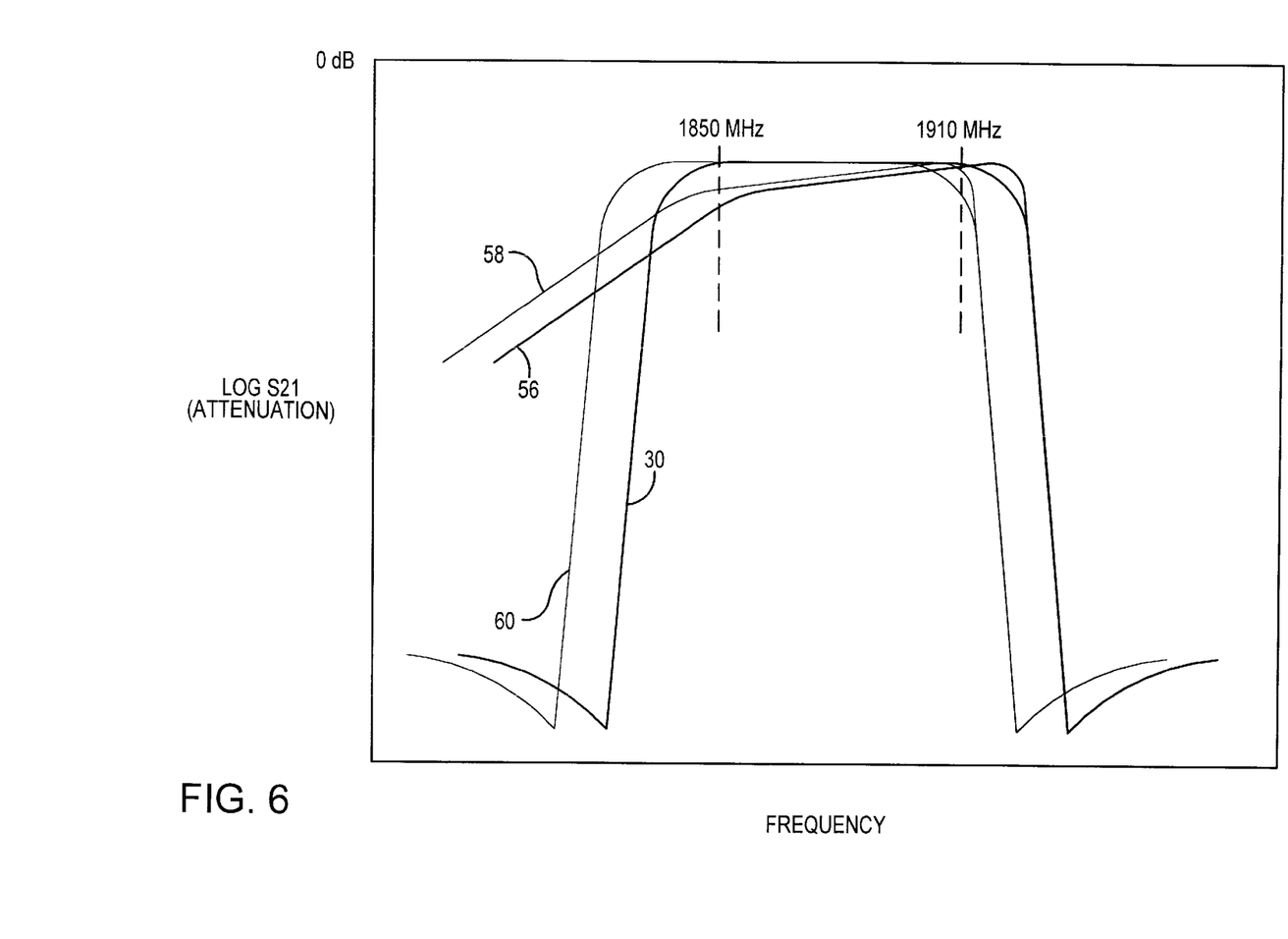
FIG. 6 shows a combination of the filter responses of FIGS. 4 and 5.

By tailoring the filter response in the manner shown in FIG. 4, the additive factors have less effect on insertion loss. In FIG. 4, the insertion loss at 1910 MHz is greater for the frequency-shifted filter response 58 than for the "normal" operation filter response 56, but the difference is less significant than is exhibited with conventional filters. Referring to FIG. 5, the "normal" operation symmetrical filter response 30 of FIG. 2 is shown with a frequency-shifted symmetrical response 60. Comparing FIGS. 4 and 5, it can be seen that the difference in insertion loss is less troublesome as a result of the response tailoring shown in FIG. 4. Moreover, the two frequency-shifted filter responses 58 and 60 are considered "worst case" scenarios. If the temperature-induced frequency shifts are less dramatic than the worst case scenario, there will be an even smaller ratio of the insertion loss differential exhibited by the asymmetrical filter response of FIG. 4 to the insertion loss differential exhibited by the conventional symmetrical filter response of FIG. 5. For purposes of comparison, the two frequency-shifted filter responses 58 and 60 and the two normal-operation filter responses 30 and 56 are shown in FIG. 6.

The description of the worst case scenario does not relate to the low frequency end of the filter response of the transmit filter. In a situation in which a CDMA-compatible duplexer is subjected to low temperatures (e.g., –20° C.), the required output of the power amplifier is particularly low. As can be seen in FIG. 6, the insertion loss at 1850 MHz is greater for the asymmetrical filter response 56 than for the conventional symmetrical filter response 30. However, if the temperature increases, the insertion loss at 1850 MHz will decrease for the asymmetrical filter response 56. Additionally, as the ambient temperature drops, the insertion loss increases for both types of filters, but the gentle slope of the asymmetrical filter response 56 ensures that the drop in insertion loss is less significant.

There are two mitigating factors that create a "negative feed-back" effect with regard to temperature drops. The first mitigating factor is that, while not shown in FIGS. 4–6, the overall insertion loss improves as temperature decreases. Electrical losses and thermo-acoustic scattering losses decrease. The second mitigating factor is associated with the fact that the power amplifier is "slaved" to the base station, as noted above. If the base station perceives that the power amplifier is not providing sufficient output, the base station will instruct the PCS device to increase the power output of the amplifier. At low temperatures, the power amplifier is more efficient and can comply with the requests of the base station without dissipating significantly greater amounts of power. However, with the extra power, the filter will warm up from both heat absorbed directly from the FBAR filter and from the residual increase in heat emanating from the power amplifier.

Figure 7:
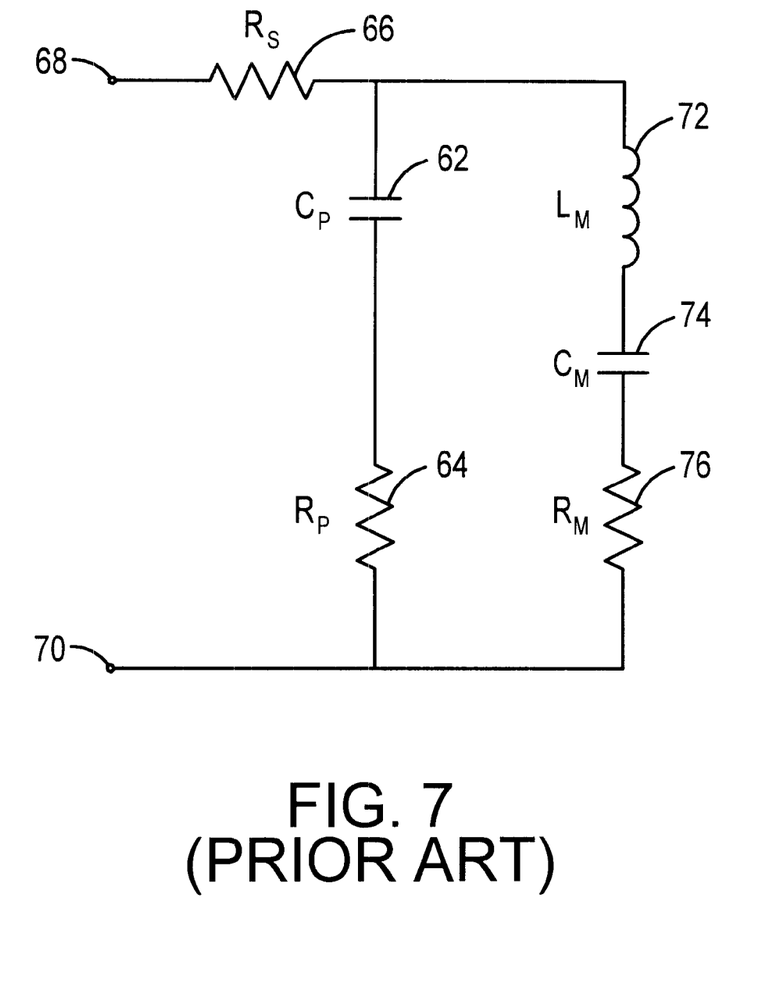
FIG. 7 is a schematic drawing of the electrical equivalent circuit of a conventional FBAR.

As previously noted, there are a number of techniques that may be used to tailor the asymmetrical filter response 56. One technique that requires additional explanation involves incorporating auxiliary inductors into the conventional electrical equivalent circuit for an FBAR. The conventional equivalent circuit is known in the art as the modified Butterworth-Van Dyke circuit, and is represented in FIG. 7. The main reactive component is the shunt capacitance ($C_p$) 62, which is the capacitance defined by the structure of the electrodes and the piezoelectric layer. The piezoelectric layer functions as the dielectric for the shunt capacitance 62. The plate resistance ($R_p$) 64 represents the series resistance of the shunt capacitance 62, while the resistance ($R_s$) 66 represents the series electrical resistance of the connections between the contacts 68 and 70 of the electrode-piezoelectric stack. Conventionally, the contacts 68 and 70 are formed of gold.

Figure 8:
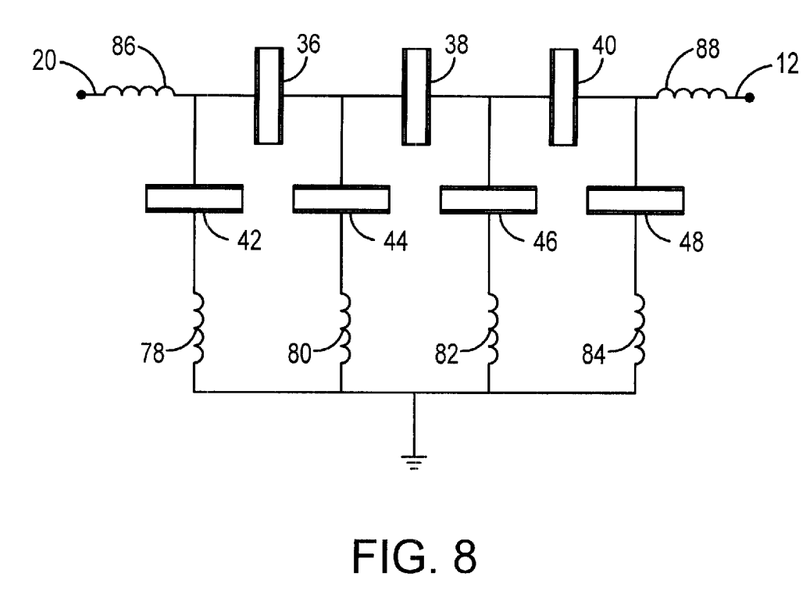
FIG. 8 is a block diagram of a transmit filter having auxiliary inductors in order to add an inductance to the electrical equivalent circuits.

The motional representations of the resonance as a result of the piezoelectric properties of the FBAR are the series connections of the inductance ($L_M$) 72, the capacitance ($C_M$) 74, and resistance ($R_M$) 76. Connecting an auxiliary inductor in series with an FBAR adds another component to the series connection of the motional components 72, 74 and 76. The auxiliary inductance has two effects. The first effect is to slightly reduce the resonant frequency of the FBAR. The second effect is to introduce an additional series resonance, while having a negligible effect on the frequency of the parallel resonance of the FBAR. Referring now to FIG. 8, each of the shunt FBARs 42, 44, 46 and 48 of FIG. 3 is shown as being connected to an auxiliary inductor 78, 80, 82 and 84. There are also auxiliary inductors 86 and 88 connected from each port 12 and 20 to the series FBARs 36, 38 and 40. Using the four auxiliary inductors 78, 80, 82 and 84 allows the four shunt FBARs to have different series resonances, even when the four FBARs are physically identical.

The additional series resonances introduced by the auxiliary inductors 78–88 provide additional zeros in the filter response of the FBAR filter. The values of the auxiliary inductors are selected to set the frequencies of the additional resonances to locate the nulls appropriately. The inductances of the auxiliary inductors 78–88 are preferably in the range of 0 nH to 5 nH. This is small compared to the inductance of the motional inductance 72 of FIG. 7, which is typically approximately 80 nH. Consequently, using relatively poor quality inductors as the auxiliary inductors will not fatally degrade the Q of the series resonance of an FBAR.

While the invention has been described with reference to FBARs that include a single piezoelectric layer, stacked FBARs may be substituted without diverging from the invention. That is, the term "FBAR" is defined herein as including stacked film bulk acoustic resonators.

What is claimed is:

1. A filter comprising:

an array of acoustic resonators which cooperate to establish a target passband of frequencies having a high frequency end and a low frequency end, said acoustic resonators being configured such that said target passband has an insertion loss profile in which a minimum insertion loss is located at least near said high frequency end of said target passband and a maximum insertion loss is located at least near said low frequency end of said target passband, said insertion loss profile within said target passband having a progressive decline from said minimum insertion loss to said maximum Insertion loss, said minimum insertion loss being substantially less than insertion toss at said low frequency end of said target passband.

2. The filter of claim 1 wherein said acoustic resonators are configured such that there is a steep roll-off adjacent to said high frequency end of said target passband and there is a generally gradual roll-off adjacent to said low frequency end.

3. The filter of claim 1 wherein said acoustic resonators are film bulk acoustic resonators (FBARs) interconnected in a topology that includes series FBARs coupled in series and includes shunt FBARs coupled between adjacent series FBARS.

4. The filter of claim 3 wherein said series and shunt FBARs establish said target passband to have a target frequency range of approximately 1850 MHz to approximately 1910 MHz.

5. The filter of claim 3 wherein said series FBARs have resonant frequencies that determine passband characteristics at said high frequency end and wherein said shunt FBARs have resonant frequencies that determine passband characteristics at said low frequency end.

6. The filter of claim 5 wherein said resonant frequencies of said series and shunt FBARs are selected for use of said array as a transmitter portion in a duplexer.

7. A filter comprising:

a plurality of series FBARs coupled in electrical series, said series FBARs being configured and being cooperative to provide first response characteristics at a first side of a filter response over a selected bandwidth, said first response characteristics including a steep roll-off from a first filter response region of minimum attenuation; and at least one shunt FBAR connected between adjacent series FBARs to provide second response characteristics at a second side of said filter response over said selected bandwidth, said second response characteristics having a minimum attenuation that is substantially greater than said minimum attenuation of said first filter response region, said filter response thereby being asymmetric about a center frequency of said target bandwidth, wherein attenuation of said first and second sides of said filter response is tailored by selectively adjusting at least one of effective coupling coefficients and impedances of said series and shunt FBARs.

8. The filter of claim 7 wherein said series and shunt FBARs have resonant frequencies such that said selected bandwidth has a frequency range of 1850 MHz to 1910 MHz.

9. The filter of claim 7 wherein said filter response defined by said series and shunt FBARs has a gradually increasing attenuation from said first filter response region through said second side of said filter response.

10. The filter of claim 7 wherein said second response characteristics exhibit a gradual roll-off outside of said selected bandwidth.

11. A method of forming a filter comprising:

fabricating a plurality of FBARs, said FBARs having at least two resonant frequencies; and interconnecting said FBARs such that said FBARs are cooperative to provide a selected filter response over a passband of interest, said steps of fabricating and interconnecting including:

(a) defining a region of tow attenuation at a first frequency end of said passband of interest and a region of substantially higher attenuation at a second frequency end of said passband of interest; and (b) establishing said selected filter response within said passband of interest to provide a progressive increase in attenuation from said region of low attenuation at said first frequency end to said region of substantially higher attenuation at said second frequency end.

12. The method of claim 11 wherein said step of interconnecting said FBARs includes connecting first FBARs in series and connecting second FBARs, with said first FBARs defining filter response characteristics at said first frequency end and with said second FBARs defining filter response characteristics at said second frequency end.

13. The method of claim 11 wherein said step of fabricating includes tailoring effective coupling coefficients and impedances of said FBARs to achieve said selected filter response.

14. The method of claim 11 wherein said steps of fabricating and interconnecting include providing a steep roll-off adjacent to said passband of interest at said first frequency end and providing a gradual roll-off adjacent to said second frequency end, said first frequency end being a high frequency end of said passband.

* * * * *